United States Patent
Park

(10) Patent No.: US 6,867,094 B2
(45) Date of Patent: Mar. 15, 2005

(54) METHOD OF FABRICATING A STACKED CAPACITOR FOR A SEMICONDUCTOR DEVICE

(75) Inventor: Dong-Gun Park, Geyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/313,249

(22) Filed: Dec. 6, 2002

(65) Prior Publication Data

US 2003/0136996 A1 Jul. 24, 2003

(30) Foreign Application Priority Data

Jan. 24, 2002 (KR) .............................. 10-2002-0004138

(51) Int. Cl.[7] .......................................... H01L 21/8242
(52) U.S. Cl. ..................... 438/253; 438/254; 438/396
(58) Field of Search .............................. 438/239, 240, 438/253, 254, 396, 397, 398; 257/295, 296, 303, 306, 307, 308, 310

(56) References Cited

U.S. PATENT DOCUMENTS

| 5,710,075 A | * | 1/1998 | Tseng ........................ 438/254 |
| 6,423,608 B1 | * | 7/2002 | Kim ........................... 438/396 |
| 6,696,713 B2 | * | 2/2004 | Ishibashi .................... 257/296 |
| 2001/0052614 A1 | * | 12/2001 | Ishibashi .................... 257/306 |

* cited by examiner

*Primary Examiner*—Hoai Pham
(74) *Attorney, Agent, or Firm*—Marger Johnson & McCollom, P.C.

(57) ABSTRACT

The disclosure describes a stacked capacitor and a method of forming the same. The method prevents a storage node of the stacked capacitor from crumbling due to lack of support, thereby improving the reliability of semiconductor devices that incorporate stacked capacitors. The disclosure also describes a stacked capacitor with a greater capacitance than a stacked capacitor in accordance with the conventional art.

11 Claims, 7 Drawing Sheets

METHOD OF FABRICATING A STACKED CAPACITOR FOR A SEMICONDUCTOR DEVICE

CROSS REFERENCE TO RELATED APPLICATIONS

This application claims the priority benefit under 35 USC § 119 of Korean Patent Application No. 2002-4138, filed on Jan. 24, 2002, which is hereby incorporated by reference in its entirety.

BACKGROUND OF THE INVENTION

1. Field of the Invention

The present invention relates to a capacitor used in a semiconductor memory device, and more particularly, to a stacked capacitor and a method of fabricating the same.

2. Description of Related Art

As the complexity of Integrated Circuits (ICs) increase, the demand for a capacitor with a small size, yet sufficient capacitance, increases as well. Conventional methods have utilized a stacked capacitor that has a storage node extending upward from the semiconductor substrate. To achieve sufficient capacitance while reducing the area occupied by the capacitor, the height of the storage node of the stacked capacitor is continuously increased.

FIGS. 1A through 1F are cross-sectional views of a semiconductor substrate illustrating a conventional process of forming a stacked capacitor.

As shown in FIG. 1A, a semiconductor substrate 100 with a gate electrode, a bit line, and impurity regions is prepared. An inter-layer insulating layer 110 with a plurality of contact holes 115 penetrating the insulating layer 110 is provided on the semiconductor substrate 100. Each of the contact holes 115 is filled with a contact pad 120 which connects a storage node of a capacitor to be formed in subsequent processes to the impurity regions. An etching stop layer 130, a sacrificial insulation layer 145, and an anti-reflection layer (ARL) 150 are further formed over the inter-layer insulating layer 110 and the contact pads 120. The anti-reflection layer 150 is composed of nitride and the sacrificial insulation layer 145 is composed of a boron phosphorous silicate glass (BPSG) or an oxide deposited by chemical vapor deposition (CVD).

Next, as shown in FIG. 1B, a photoresist film pattern 190 is formed on the antireflection layer 150. Then, the anti-reflection layer 150, the sacrificial insulation layer 145, and the etching stop layer 130 is selectively etched according to the photoresist film pattern 190, thereby forming openings 155 to expose the contact pads 120.

Next, referring to FIG. 1C, the photoresist film pattern 190 is removed using a conventional ashing process. Cleaning processes using solutions containing sulfuric acid (SCl) or hydrofloric acid (HF) are performed to remove polymer. The polymer is a byproduct of the earlier etching process that forms on the inner walls of openings 155. During these cleaning processes, the sacrificial insulation layer 145 and the inter-layer insulation layer 110 is etched at a greater etch rate than the etching stop layer 130.

Next, a first conductive layer 160 is formed on an entire surface of the resultant structure including the inner surface of the openings 155. The first conductive layer 160 will form a portion of the capacitor. Next, a gap-filling CVD process is performed to fill the openings 155 with an insulation layer 165 composed of a material such as high temperature undoped silica glass (USG).

Next, referring to FIG. 1D, a chemical-mechanical polishing process or "etch-back" process is applied to the high temperature USG insulation layer 165 until the sacrificial insulation layer 145 is exposed, thereby forming a plurality of storage nodes 161 by separating the first conductive layer 160 into several components.

Next, referring to FIG. 1E, the sacrificial insulation layer 145 and the insulation layer 165 seen in FIG. 1D are removed by a wet etching process. The etching stop layer 130 prevents the underlying inter-layer insulation layer 110 from being exposed by the wet etching process.

Next, referring to FIG. 1F, a dielectric layer 170 is formed on the entire surface of the resultant structure and then an oxidation process or rapid thermal annealing (RTA) is performed. The dielectric layer is formed of one of the group consisting of NO, ONO, $Ta_2O_5$ and $Al_2O_3$ Finally, a second conductive layer 175 is formed on the dielectric layer 170, which completes the capacitor structure.

The conventional method shown in FIGS. 1A–1F for forming a capacitor has some drawbacks. For example, in FIG. 1E, when the height h1 of the storage nodes 161 is too great, the storage nodes 161 may crumble during the subsequent cleaning processes because they lack support. Furthermore, when the distance d1 between adjacent storage nodes 161 is too small, the storage nodes may become abutted, whereby a connecting bridge is formed between them.

To avoid these drawbacks, the distance d1 must be constantly maintained everywhere between two adjacent storage nodes 161, and the height of the storage node 161 must be limited to an adequate extent. Accordingly, these considerations limit the complexity of the IC and prevent size reductions of the semiconductor chip. Additionally, when the sacrificial insulation layer 145 is etched to form the openings 155, through holes frequently form in the inter-layer insulation layer 110 due to over-etching.

Over-etching of the sacrificial insulation layer 145 must be avoided. Over-etching makes it difficult to achieve a vertical profile for the openings 155. Without a vertical profile, the surface area inside the openings 155 is reduced and therefore the area of storage node 161 that is conformable to the inner surfaces of the openings 155 is reduced. The reduced area of storage nodes 161 also reduces the capacitance of the capacitor. Therefore, it is very difficult to get enough capacitance and enough contact area between the storage node and the contact pad.

SUMMARY OF THE INVENTION

It is an object of the present invention to overcome the problems discussed above, thereby providing a stacked capacitor and a method of forming the same that avoids the crumbling of storage nodes and the abutting of adjacent storage nodes by forming a supporter in a space between adjacent storage nodes.

It is another object of the present invention to provide a stacked capacitor and a method of forming the same having a greater capacitance than a conventional capacitor by forming an opening in which a storage node is formed, the opening having a consistent vertical profile.

In accordance with one aspect of the present invention, there is provided a stacked capacitor comprising: a semiconductor substrate; a inter-layer insulation layer formed on the semiconductor substrate, the inter-layer insulation layer having at least one contact hole in which a contact pad is formed; a storage node formed on the inter-layer insulation layer and connected to the contact pad; an insulation layer formed in a space between the adjacent storage nodes for supporting the storage node, a first and a second etching stop layers formed on and under the insulation layer; a dielectric layer formed on the storage node; and a plate node formed on the dielectric layer.

In accordance with another aspect of the present invention, there is provided a method of fabricating a stacked capacitor comprising: forming an inter-layer insulation layer having at least one contact hole in which a contact pad is formed on a semiconductor substrate; sequentially forming a first etching stop layer, a first insulation layer, a second etching stop layer and a second insulation layer on the inter-layer insulation layer; forming an opening by etching the first etching stop layer, the first insulation layer, the second etching stop layer and the second insulation layer to expose the contact pad; forming a first conductive layer on the entire surface of a resultant structure formed on the semiconductor substrate; forming a third insulation layer on the first conductive layer; etching the first conductive layer and the third insulation layer to expose the second insulation layer; removing the third insulation layer and the second insulation layer, thereby producing a storage node formed by the first conductive layer; and forming a dielectric layer and a plate node on the storage node.

The first and the second etching stop layers are composed of nitride and stop the etching process that forms the openings.

The first insulation layer supports the storage nodes to prevent crumbling and is composed of a single layer such as a plasma of tetra-ethyl-ortho silicate (P-TEOS) oxide layer, a plasma-enhanced chemical vapor deposition (PECVD) oxide layer, or a BPSG layer. Alternatively, multiple stacked layers may be used including P-TEOS oxide layers, PECVD oxide layers, or BPSG layers.

The second insulation layer and the third insulation layer are removed by wet etching using HF solution.

The first conductive layer and the third insulation layer are etched under conditions where the etching rates of the first conductive layer and the third insulation layer are almost the same.

BRIEF DESCRIPTION OF THE DRAWINGS

For a more complete understanding of the present invention and its advantages, reference is now made to the accompanying drawings, in which like reference numerals denote like parts, and in which.

DETAILED DESCRIPTION OF THE INVENTION

Reference will now be made in detail to preferred embodiments of the present invention, examples of which are illustrated in the accompanying drawings.

FIGS. 2A to 2F are cross-sectional views of a semiconductor device illustrating a process of forming a stacked capacitor in accordance with an embodiment of the present invention.

Figure 2A:
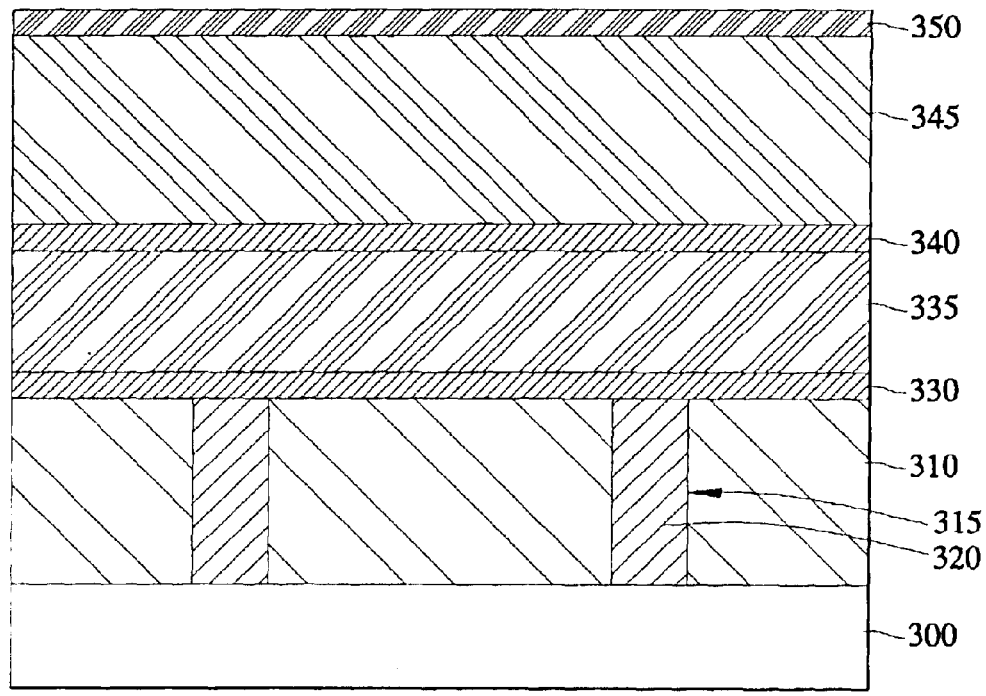
FIGS. 2A to 2F are cross-sectional views of a semiconductor device illustrating a process of forming a stacked capacitor in accordance with an embodiment of the invention.

As shown in FIG. 2A, a semiconductor substrate 300 is prepared and a plurality of impurity regions (not shown) are formed in the semiconductor substrate 300. A bit line (not shown) is formed over the semiconductor substrate and is in contact with one of the impurity regions (not shown).

Next, an inter-layer insulation layer 310 is formed on the semiconductor substrate 300 and a contact hole 315 is formed by selectively etching a portion of the inter-layer insulation layer 310 over one of the impurity regions, thereby exposing the impurity region. Next, a contact pad 320 is formed in the contact hole 315.

Next, a first etching stop layer 330 and a first insulation layer 335 are sequentially formed on the inter-layer insulation layer 310 and the contact pad 320. The first etching stop layer 330 stops a subsequent etching process. The first etching stop layer 330 comprises a silicon nitride $Si_3N_4$ layer that is formed to a thickness of approximately 30 nm by a low pressure chemical vapor deposition (LPCVD) process. The first insulation layer 335 is an oxide layer formed using P-TEOS gas or formed by a PECVD process. The first insulation layer 335 can also be BPSG. The thickness of the first insulation layer 335 is not specifically limited.

After forming the first insulation layer 335, cleaning of the semiconductor substrate 300 is performed in a well-known way using a SC1 solution.

Next, a second etching stop layer 340 and a second insulation layer 345 are sequentially formed on the first insulation layer 335, and a anti-reflection layer 350 is formed on the second insulation layer 345. The second etching stop layer 340 is formed to a thickness of approximately 10–30 nm. The second insulation layer 345 is formed of an oxide layer using P-TEOS, an oxide layer formed by PECVD process, or a BPSG layer. The thickness of the second insulation layer 345 is determined by considering the desired capacitance which is highly dependent on the surface area and height of a plurality of storage nodes to be formed in a subsequent process. That is, the second insulation layer 345 is of a thickness equal to that of a desired height of the storage node, the height at which the storage node will not crumble. The anti-reflection layer 350 prevents light from being reflected during the photo-lithography process, and is preferably formed of a plasma SiON (P-SiON) layer.

In accordance with one embodiment of the present invention, the first insulation layer 335 and the second insulation layer 345 are composed of BPSG. Before forming the antireflection layer 350, a low temperature heat treatment at about 650° C. is performed on the semiconductor substrate 300, thereby reducing the etching rate of layers to be etched during a subsequent wet-etching process.

Figure 2B:
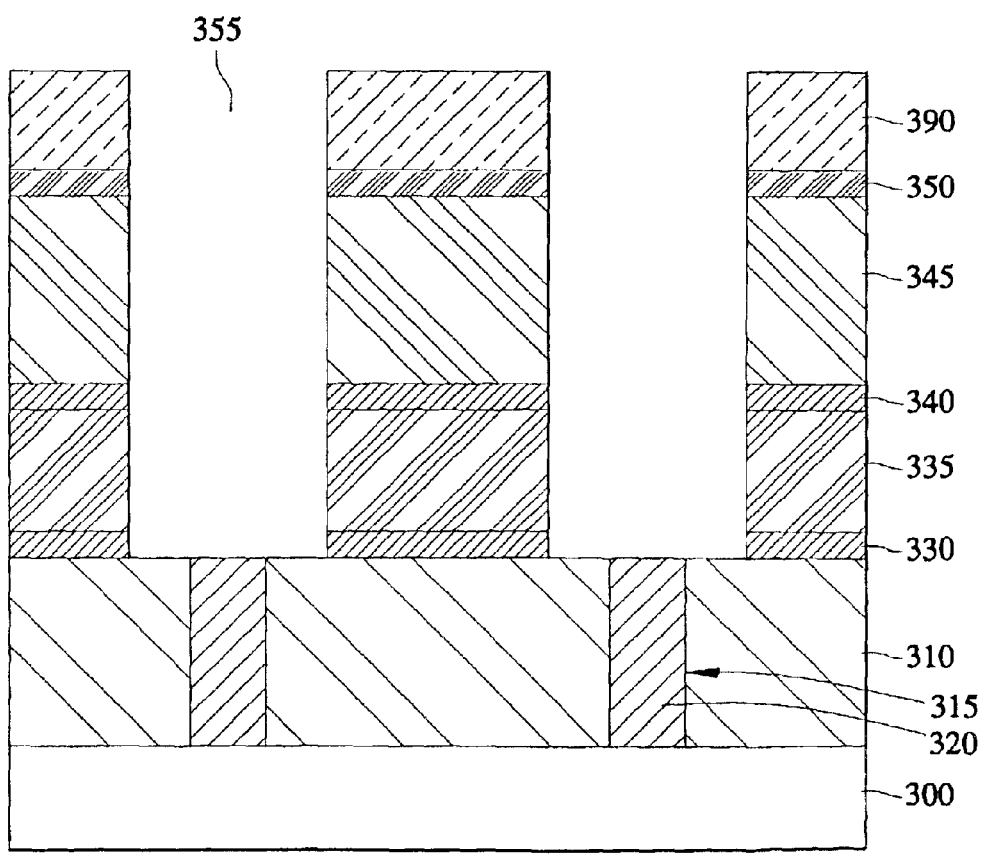

Next, referring to FIG. 2B, a photoresist film pattern 390 is formed on the antireflection layer 350. The layers 350, 345, 340, 335, and 330 are then selectively etched to expose the contact pad 320 and forming a node opening 355 in which a storage node will be formed in a subsequent process.

In accordance with the present invention, over-etching of the first insulation layer 335 can be performed because the nitride layers 330 and 340 are formed under the first insulation layer 335 and the second insulation layer 345, respectively, to a sufficient thickness to prevent a through hole from being formed. Therefore, openings 355 with consistent vertical profiles can be achieved, thereby providing sufficient surface area in the opening 355 where a storage node will be formed in a subsequent process.

Figure 2C:
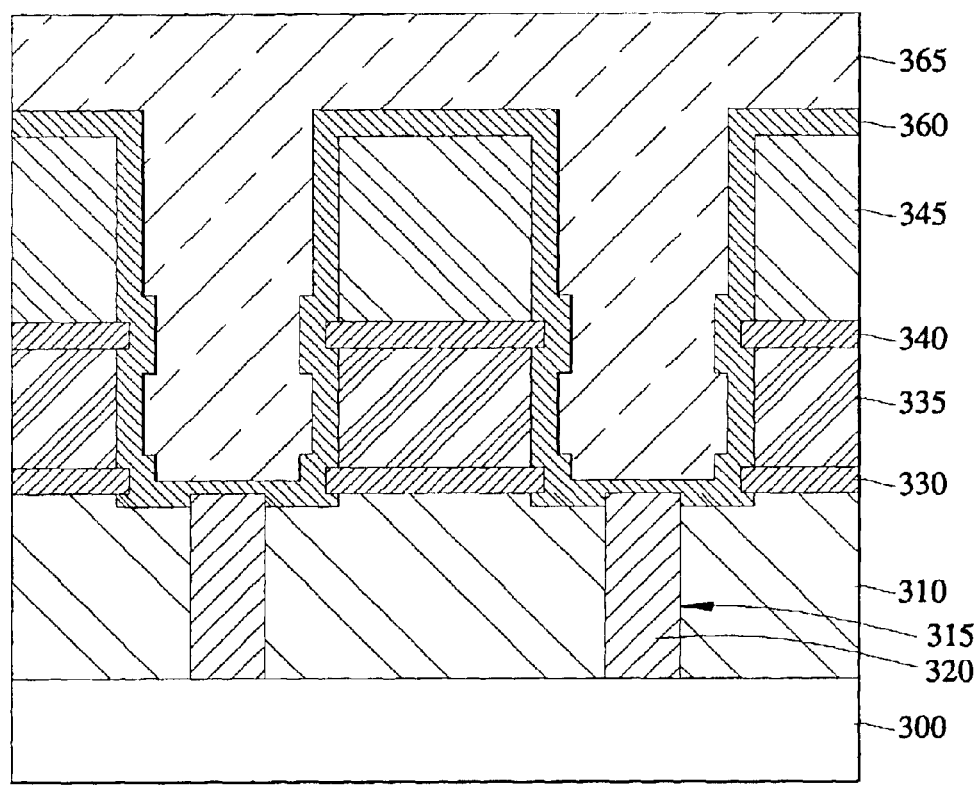

Referring to FIG. 2C, the photoresist film pattern 390 and the anti-reflection layer 350 of FIG. 2B are removed. Next, the semiconductor substrate 300 is cleaned with sulfuric acid solution and HF solution, thereby removing polymer which is formed on the inner walls of the opening 355 and is an undesired by-product of the etching processes.

The first and the second etching stop layers 330, 340 are less easily etched by the cleaning solutions of SC1 and HF during the aforementioned cleaning processes than the first and the second insulation layers 335, 345. In other words, the first and the second insulation layers 335, 345 do not extend in the horizontal direction as much as the first and the second etching stop layers 340, 360.

Next, a first conductive layer 360 used for a storage node of a capacitor is formed on an entire surface of the resultant structure left behind after the cleaning process. Then, a third insulation layer 365 is formed on the first conductive layer 360 to completely fill the openings 355. The third insulation layer 365 is formed of a high temperature USG layer which is composed of undoped silicon oxide formed under high temperature conditions. The first conductive layer 360 is formed from one of the group consisting of a phosphorous doped polysilicon layer, a titanium nitride TiN layer, or a double layer comprising both a phosphorus doped polysilicon layer and a TiN layer. Therefore, the addition of the first conductive layer 360 and the third insulation layer 365 to the structure formed after the cleaning processes are complete results in the structure shown in FIG. 2C.

Figure 2D:
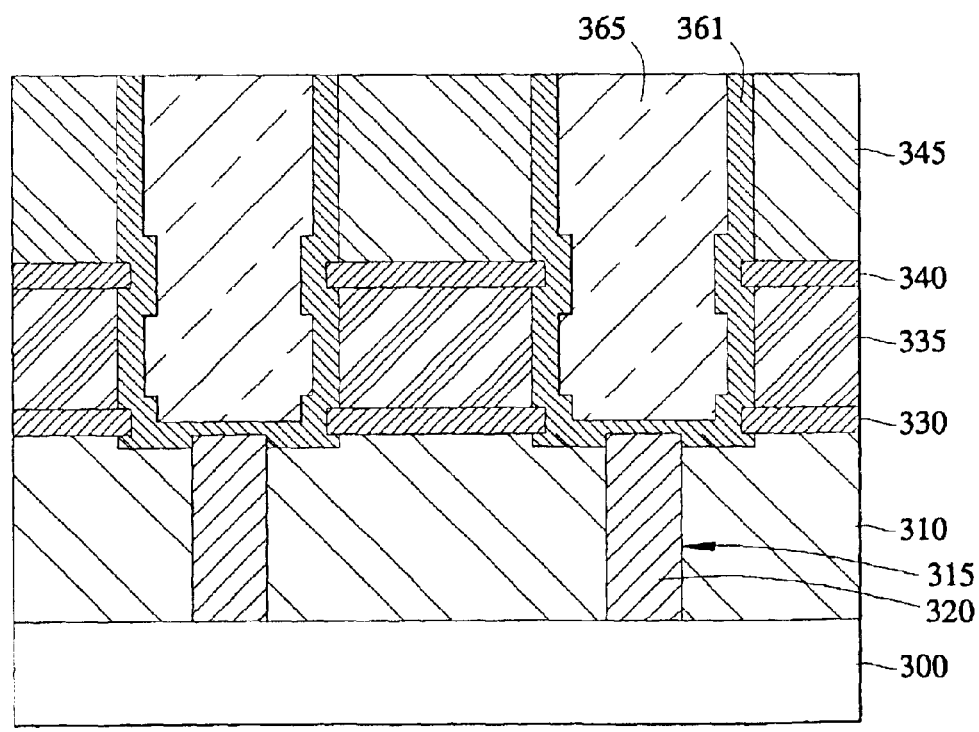

The first conductive layer 360 and the third insulation layer 365 are then dry-etched under conditions where the ratio of the etching selectivity between the third insulation layer 365 and the first conductive layer 360 is 1:1. As a result, the first conductive layer 360 is segmented into a plurality of vertical layers, connected at the lower end by a horizontal layer across the contact pad 320, as shown in FIG. 2D. Each of the separated first conductive layers is a storage node 361 of a capacitor.

Figure 2E:
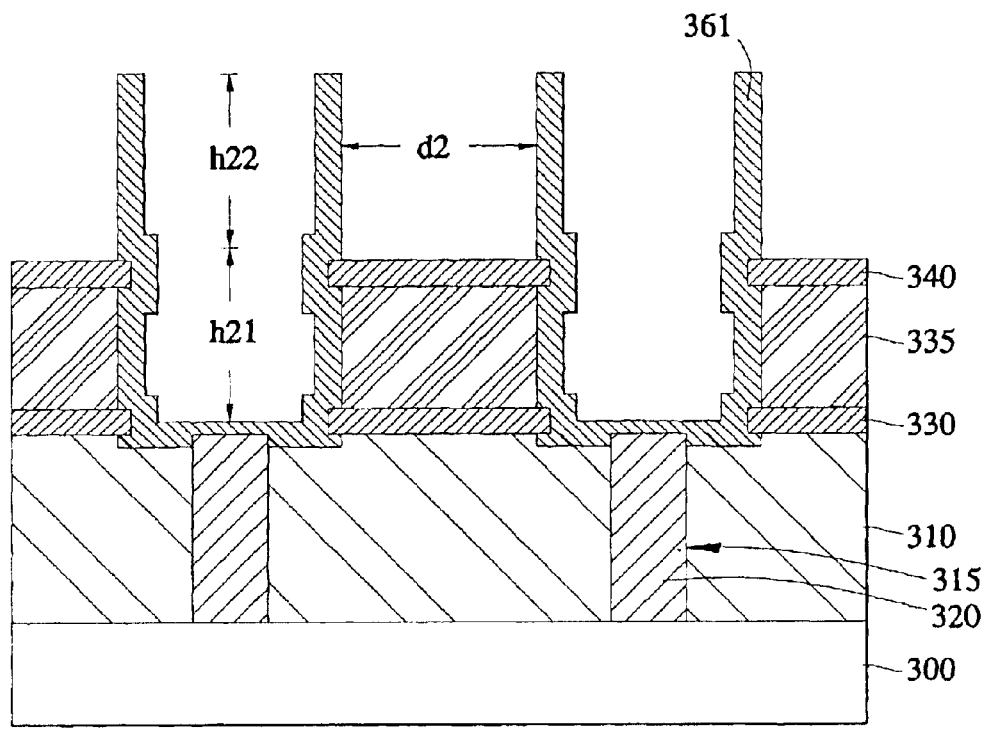

Next, the remaining portions of the third insulation layer 365 and the second insulation layer 345 are removed by a wet etching process using HF solution, resulting in the structure shown in FIG. 2E.

After the wet etching process, the first insulation layer 335 remains between adjacent storage nodes 361, supporting the storage nodes 361 up to the extent of height h21 and preventing collapse of the storage nodes 361.

Figure 1A:
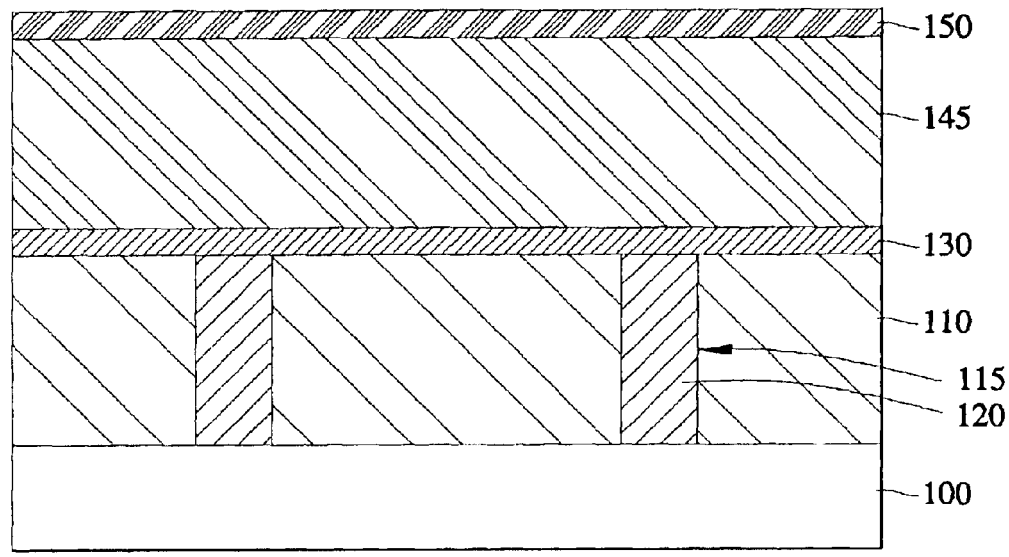
FIGS. 1A to 1F are cross-sectional views of a semiconductor device illustrating a conventional process of forming a stacked capacitor.
Figure 1B:
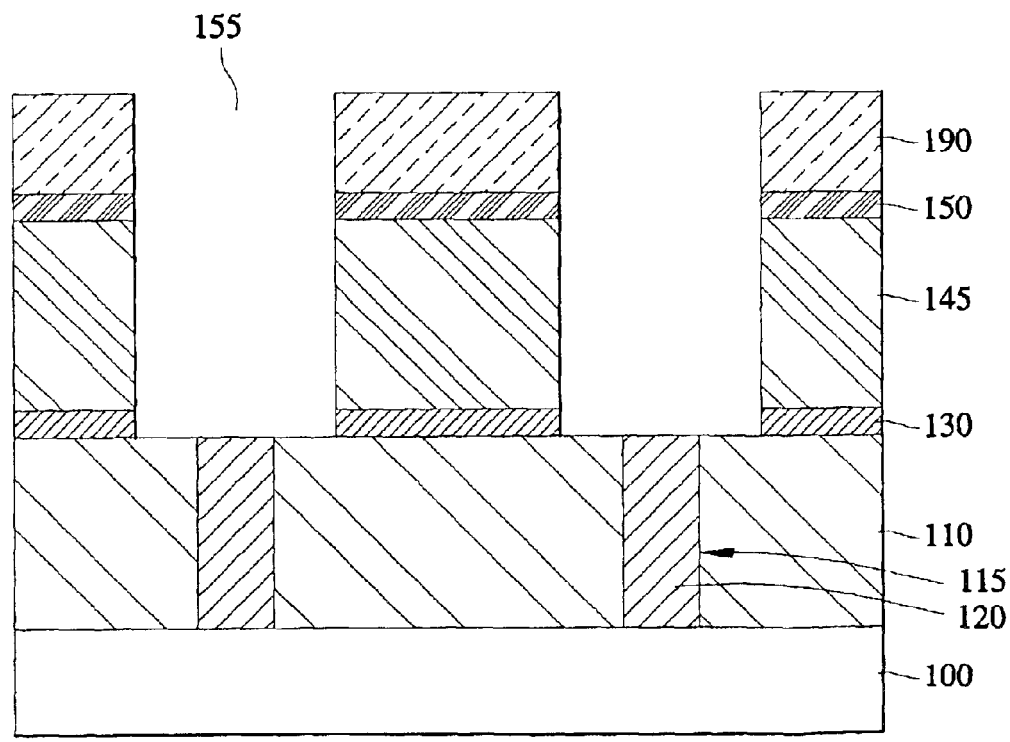
Figure 1C:
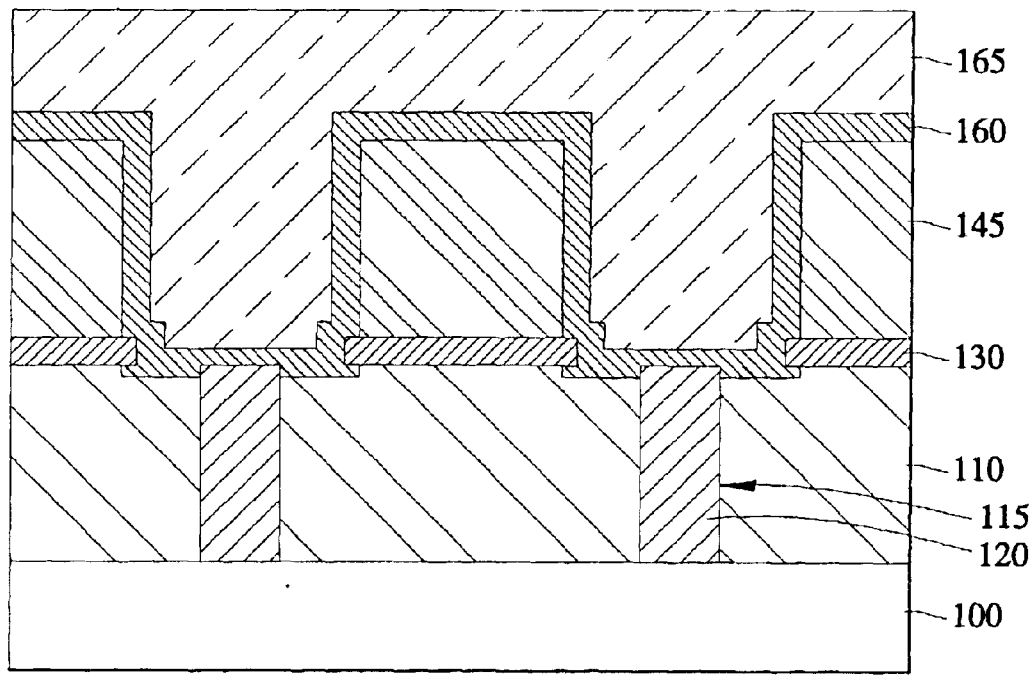
Figure 1D:
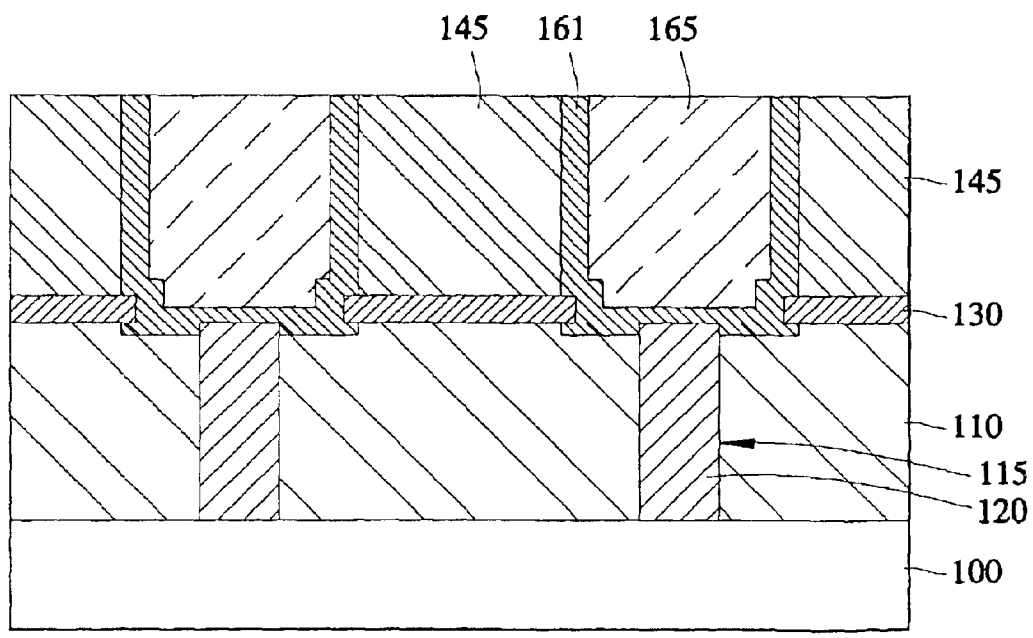
Figure 1E:
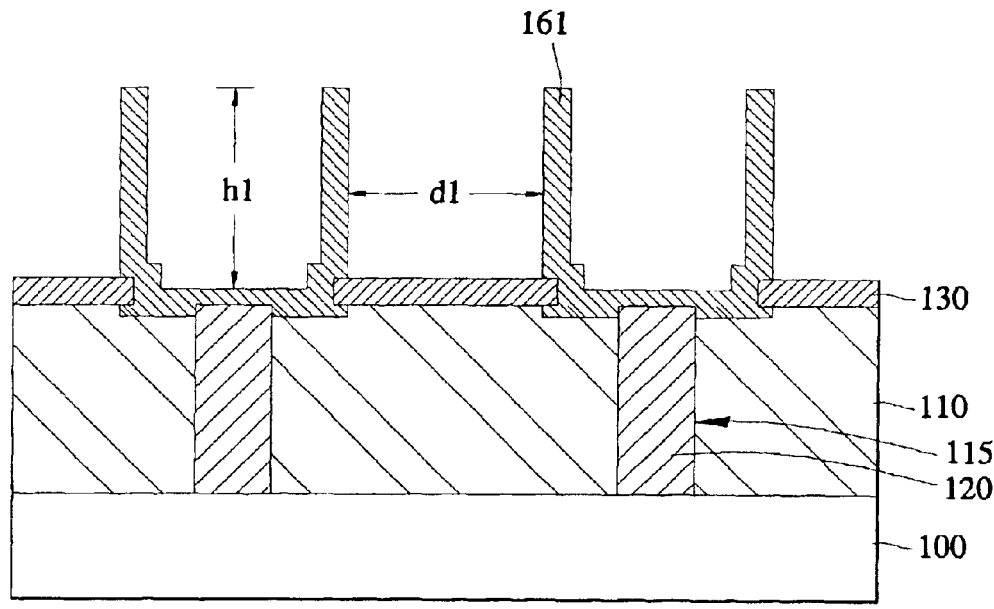
Figure 1F:
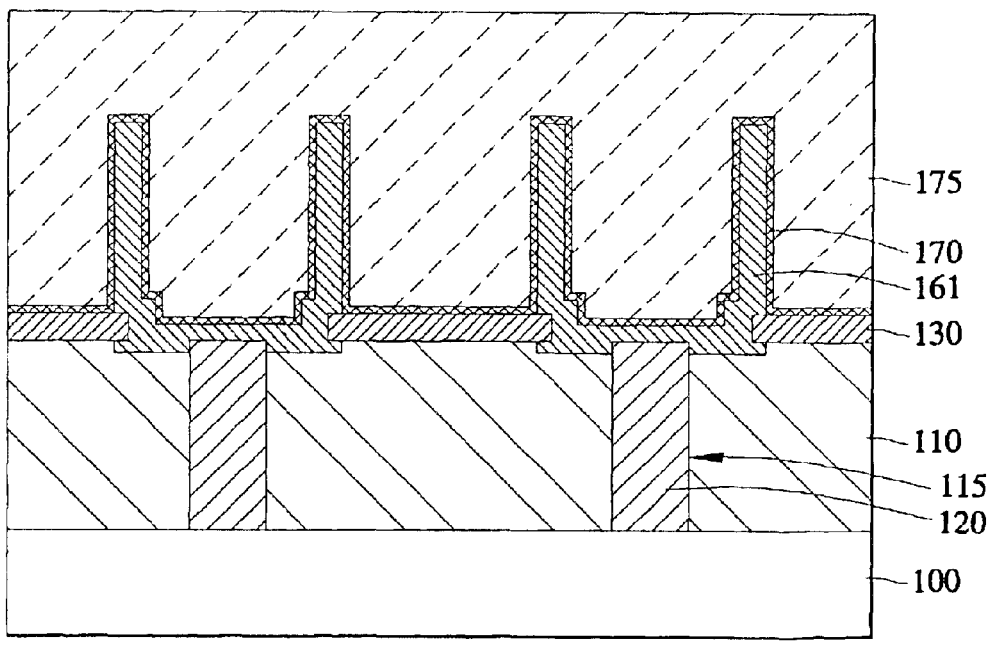

In accordance with one embodiment of the present invention, a height of the storage node 361 is the same as the sum of a height h21 of the first insulation layer 335 and a height h22 of the second insulation layer 345 (shown in FIG. 2D). Therefore, the heights of storage nodes 361 are greater than the heights of conventional storage nodes 161 shown in FIG. 1E. Thus, capacitors formed in accordance with embodiments of the invention possess increased capacitance in comparison with the conventional art capacitor. Furthermore, the storage nodes 361 are prevented from crumbling because support is located between adjacent storage nodes 361. Additionally, the support from the first insulation layer 335 prevents the adjacent storage nodes 361 from being abutted because the distance d2 between the adjacent storage nodes 361 remains consistent.

Figure 2F:
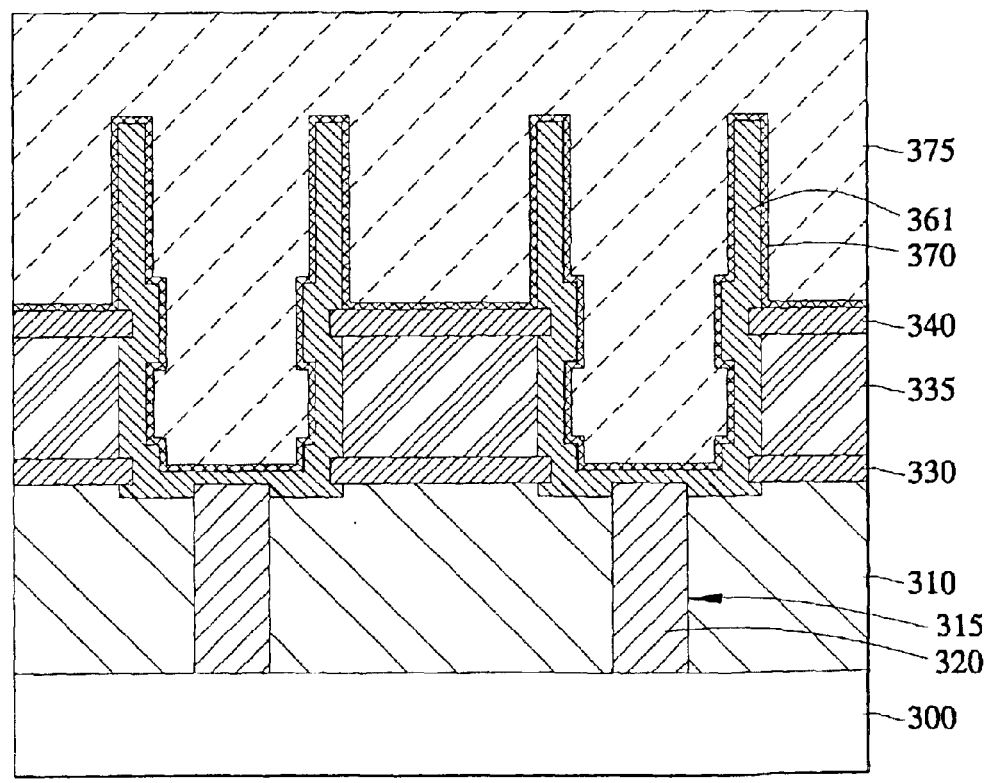

Next, a dielectric layer 370 and a second conductive layer 375 used as a plate node of a capacitor are sequentially deposited on an entire surface of the structure shown in FIG. 2E, including a top surface of the storage nodes 361. Thus, a capacitor is formed as shown in FIG. 2F.

Preferably, the dielectric layer 370 is formed of nitride-oxide (NO), oxide-nitride-oxide (ONO), tantalum oxide ($Ta_2O_5$), nitride-$Ta_2O_5$, aluminum oxide ($Al_2O_3$), or titanium oxide (TiO). The second conductive layer 375 is composed of a doped polysilicon layer, a TiN layer, or a combination of doped polysilicon and TiN layers.

Figure 3:
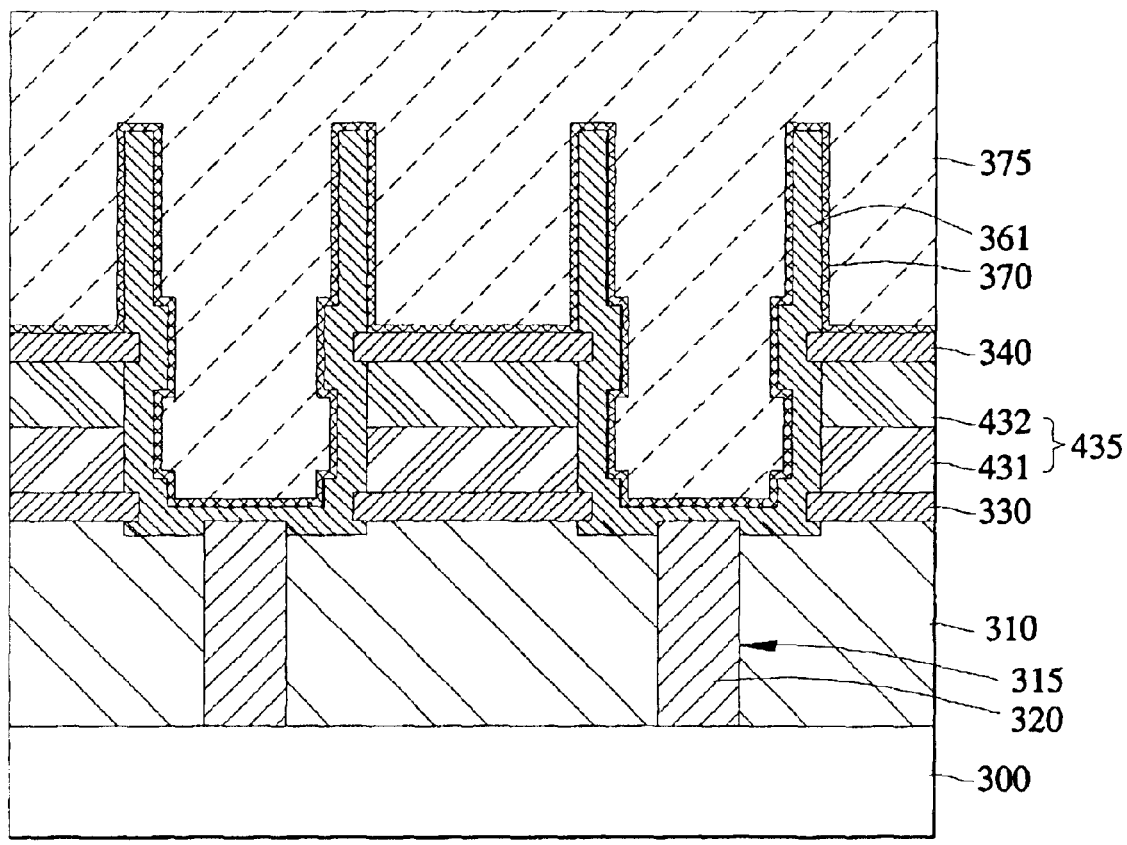
FIG. 3 is a cross-sectional view of a semiconductor device having a stacked capacitor in accordance with an embodiment of the invention.

FIG. 3 is a cross-sectional view of a semiconductor device showing a capacitor in accordance with another embodiment of the present invention. The capacitor in FIG. 3 includes a first insulation layer 435 that is different from the embodiment shown in FIG. 2F. The first insulation layer 435 is formed of a double layer comprising BPSG layer 431 and P-TEOS layer 432, which are sequentially stacked. Even though the second insulation layer (similar to second insulation layer 345 in FIGS. 2A–2D) is not shown in FIG. 3, the second insulation layer may also be formed of a double layer or a plurality of layers.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating a stacked capacitor, comprising:

forming an inter-layer insulation layer on a semiconductor substrate having at least one contact hole in which a contact pad is formed;

sequentially forming a first etching stop layer on the inter-layer insulation layer, a first insulation layer on the first etching stop layer, a second etching stop layer on the first insulation layer, and a second insulation layer on the second etching stop layer;

forming an opening that exposes the contact pad;

forming a first conductive layer on an entire surface of a first resultant structure formed over the semiconductor substrate;

forming a third insulation layer on the first conductive layer;

etching the first conductive layer and the third insulation layer to expose the second insulation layer under conditions where the etching rates of the first conductive layer and the third insulation layer are substantially equal;

removing the second insulation layer and the third insulation layer, thereby producing a storage node formed by the first conductive layer;

forming a dielectric layer on an entire surface of a second resultant structure formed over the semiconductor substrate; and forming a second conductive layer on the dielectric layer, the second conductive layer acting as a plate node.

2. The method of claim 1, wherein the first etching stop layer comprises a nitride layer that is approximately 30 nm thick.

3. The method of claim 1, wherein the second etching stop layer comprises a nitride layer that is approximately in the range of 10 to 30 nm thick.

4. The method of claim 1, wherein the first insulation layer supports the storage node and comprises at least one layer chosen from the group consisting of a P-TEOS oxide layer, a PECVD oxide layer, and a BPSG layer.

5. The method of claim 1, wherein removing the second insulation layer and the third insulation layer comprises wet etching using a HF solution.

6. The method of claim 5, wherein the second insulation layer is chosen from the group consisting of a P-TEOS oxide layer, a PECVD oxide layer, and a BPSG layer.

7. The method of claim 6, wherein the second insulation layer is heat treated to reduce its etch rate in a subsequent etching process.

8. The method of claim 1, wherein the third insulation layer comprises a high temperature USG layer.

9. The method of claim 1, wherein the dielectric layer comprises at least one layer chosen from the group consisting of a NO layer, an ONO layer, a $Ta_2O_5$ layer, an $Al_2O_3$ layer, and a TiO layer.

10. The method of claim 1, wherein the first conductive layer and the second conductive layer comprise at least one layer chosen from the group consisting of a doped polysilicon layer and a TiN layer.

11. A method of fabricating a stacked capacitor, comprising:

forming an inter-layer insulation layer on a semiconductor substrate having at least one contact hole in which a contact pad is formed;

sequentially forming a first etching stop layer on the inter-layer insulation layer, a first insulation layer on the first etching stop layer, a second etching stop layer on the first insulation layer, and a second insulation layer on the second etching stop layer, the second insulation layer chosen from the group consisting of a P-TEOS oxide layer, a PECVD oxide layer, and a BPSG layer;

heat-treating the second insulation layer to reduce its etch rate in a subsequent etching process;

forming an opening that exposes the contact pad;

forming a first conductive layer on an entire surface of a first resultant structure formed over the semiconductor substrate;

forming a third insulation layer on the first conductive layer;

etching the first conductive layer and the third insulation layer to expose the second insulation layer;

removing the second insulation layer and the third insulation layer by wet etching with a HF solution, thereby producing a storage node formed by the first conductive layer;

forming a dielectric layer on an entire surface of a second resultant structure formed over the semiconductor substrate; and forming a second conductive layer on the dielectric layer, the second conductive layer acting as a plate node.

* * * * *